(12) United States Patent
Koch et al.

(10) Patent No.: US 6,359,218 B1
(45) Date of Patent: Mar. 19, 2002

(54) MODULAR AND EXPANDABLE ENCLOSURE FOR ELECTRONIC EQUIPMENT

(75) Inventors: Mark J. Koch, Milpitas; James B. Harmon, Mountain View, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/542,162

(22) Filed: Apr. 4, 2000

(51) Int. Cl.$^7$ .................................................. H05K 5/00
(52) U.S. Cl. ........................ 174/50; 220/4.26; 220/4.02
(58) Field of Search ........................ 174/35 R, 35 MS, 174/50; 361/816, 818, 752, 800; 220/4.26, 4.02

(56) References Cited

U.S. PATENT DOCUMENTS

| | | | | |
|---|---|---|---|---|
| 5,008,487 A | * | 4/1991 | Shimmyo | ................. 174/35 R |
| 5,747,734 A | * | 5/1998 | Kozlowski et al. | ........... 174/50 |
| 6,002,086 A | * | 12/1999 | Yajima | ..................... 174/35 R |
| 6,194,655 B1 | * | 2/2001 | Lange, Sr. et al. | ...... 174/35 GC |

* cited by examiner

*Primary Examiner*—Dean A. Reichard
*Assistant Examiner*—Hung V Ngo
(74) *Attorney, Agent, or Firm*—Weingarten, Schurgin, Gagnebin & Lebovici LLP

(57) ABSTRACT

A modular enclosure for electronic equipment of selectable height is achieved via the use of intermediate stackable frame members. The enclosure consists of a lid and a base and optionally, one or more intermediate frame members that may be disposed between the lid and the base. The lid and base may be assembled one to the other to form a minimum height enclosure. To obtain enclosures of greater height than the minimum height, one or more intermediate frame members are interposed between the lid and the base.

13 Claims, 4 Drawing Sheets

MODULAR AND EXPANDABLE ENCLOSURE FOR ELECTRONIC EQUIPMENT

CROSS REFERENCE TO RELATED APPLICATIONS

N/A

STATEMENT REGARDING FEDERALLY SPONSORED RESEARCH OR DEVELOPMENT

BACKGROUND OF THE INVENTION

The present invention relates to enclosures for electronic equipment and more particularly to a modular and expandable enclosure particularly suited for prototyping or limited production applications.

During the development of electronic equipment, prototypes are typically developed to assure that the equipment works in the intended manner. Often, a need exists to house electronics under development in a prototype enclosure during this development phase. As a result of the diverse nature and size of electronic equipment that may be developed within an organization, the sizes of the enclosures needed for different prototyping applications may vary considerably in height.

Vendors will provide custom enclosures for prototype applications, however, the development of custom enclosures for prototype applications can be both costly and introduce undesirable delays into the development process. Often, suppliers of custom enclosures seek significant tooling charges for the manufacture of such enclosures.

Some enclosures are commercially available for prototype applications. One such enclosure is identified as the CLS-625 series from PAC-TEC. The PAC-TEC enclosure includes a bottom cover, a top cover, side filler panels and front and rear panels. The front and rear panels must be particularly sized for the particular height of the desired enclosure. Thus, if multiple sizes of enclosures are desired, different sizes of front and rear panels must be maintained in inventory or procured.

Accordingly, it would be desirable to have an enclosure design for electronic equipment which can easily grow in size depending upon the particular needs of the electronic equipment under development and which minimizes the number of parts which must be inventoried to support diverse enclosure heights.

BRIEF SUMMARY OF THE INVENTION

A modular enclosure for electronic equipment is disclosed which facilitates assembly of an equipment enclosure of a desired height. The enclosure consists of a lid, a base and optionally, one or more intermediate frame members that may be disposed between the lid and the base. The lid and base may be assembled one to the other to form a minimum height enclosure. To obtain enclosures of greater height than the minimum height, one or more intermediate frame members are interposed between the lid and the base.

BRIEF DESCRIPTION OF THE SEVERAL VIEWS OF THE DRAWING

The invention will be more fully understood by reference to the following Detailed Description of the Invention in conjunction with the drawings of which.

DETAILED DESCRIPTION OF THE INVENTION

Consistent with the present invention, a modular enclosure for housing electrical or electronic equipment is disclosed. The disclosed enclosure has a configuration that allows the height of the enclosure to be increased from a minimum height enclosure via the insertion of a selected number of intermediate frame members between a base and a lid. In a minimal configuration that has the smallest height, the enclosure consists solely of the base and the lid. One or more intermediate frame members may be disposed between the base and the lid to provide an enclosure of a greater desired height.

Figures 1, 2:
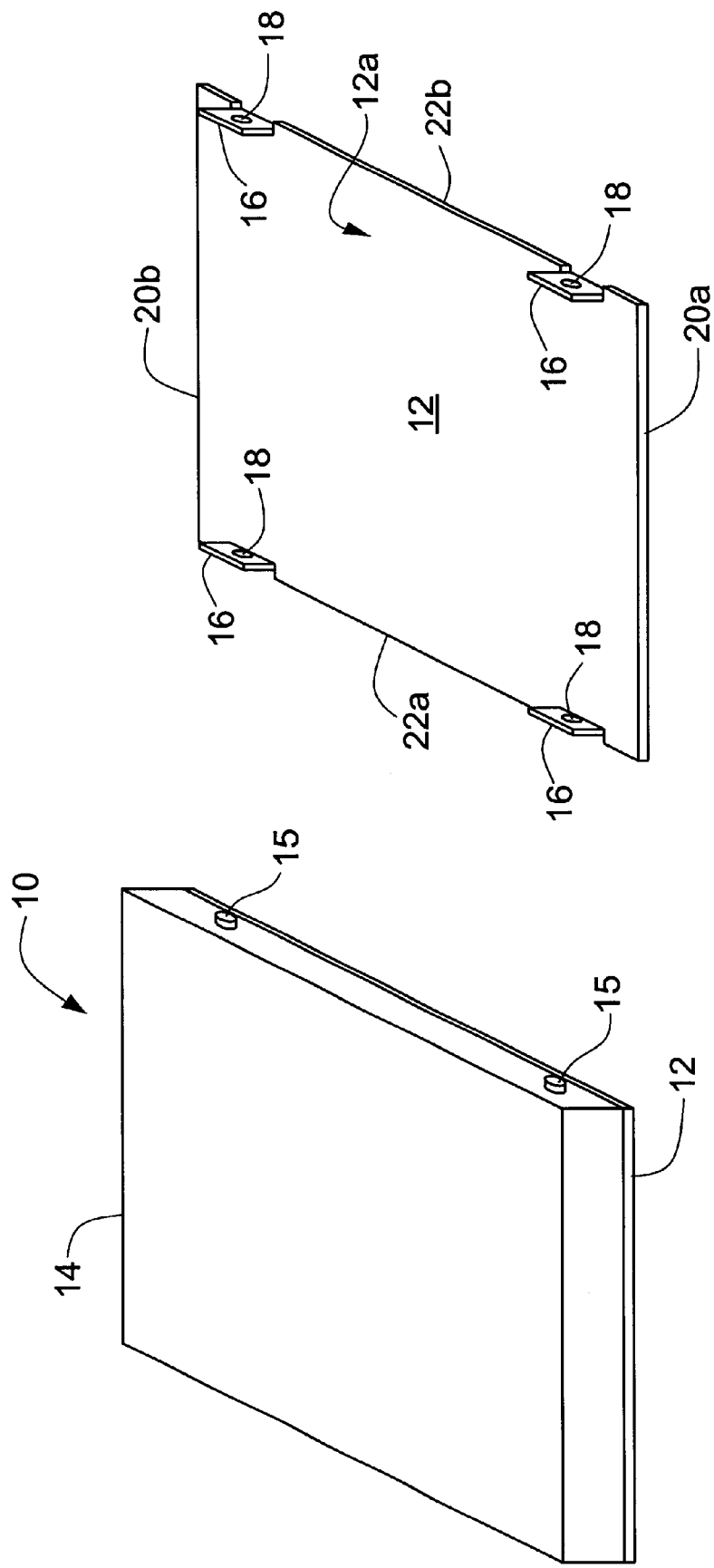
FIG. 1 is a perspective view of a preferred minimum height embodiment of the presently disclosed modular enclosure.
FIG. 2 is a perspective view of a base for use in constructing the modular enclosure depicted in FIG. 1.

The enclosure, in a minimum height embodiment form is depicted in FIG. 1. As illustrated in FIG. 1, the assembled enclosure 10 includes a base 12 and a lid 14. The lid 14 is assembled to the base 12 via the use of fasteners 15 as described with greater particularity below.

A preferred embodiment of the base 12 is illustrated in FIG. 2. Referring to FIG. 2, the base 12 is generally rectangular and includes a bottom surface (not visible) and a top surface 12a. The bottom surface corresponds to an external surface of the enclosure 10 and the top surface 12a of the base 12 corresponds to an internal surface of the enclosure 10 when the lid 14 is assembled to the base 12. The base 12 has a front edge 20a, a rear edge 20b and left and right side edges 22a and 22b respectively. A plurality of tabs 16 extend generally perpendicularly from the base 12 adjacent to respective side edges 22a and 22b. Openings 18 are provided in the tabs 16 as discussed hereinafter. In the present embodiment, two tabs are provided along each of the side edges 22a and 22b. One tab 16 is located adjacent each side edge near the front edge 20a and the other tab 16 is located adjacent each side edge near the rear edge 20b. The tabs 16 have an inward facing tab surface which opposes the tab 16 along the opposite side edge and an outward facing tab surface on the opposite side of the tab 16 from the inward facing tab surface.

Figure 3:
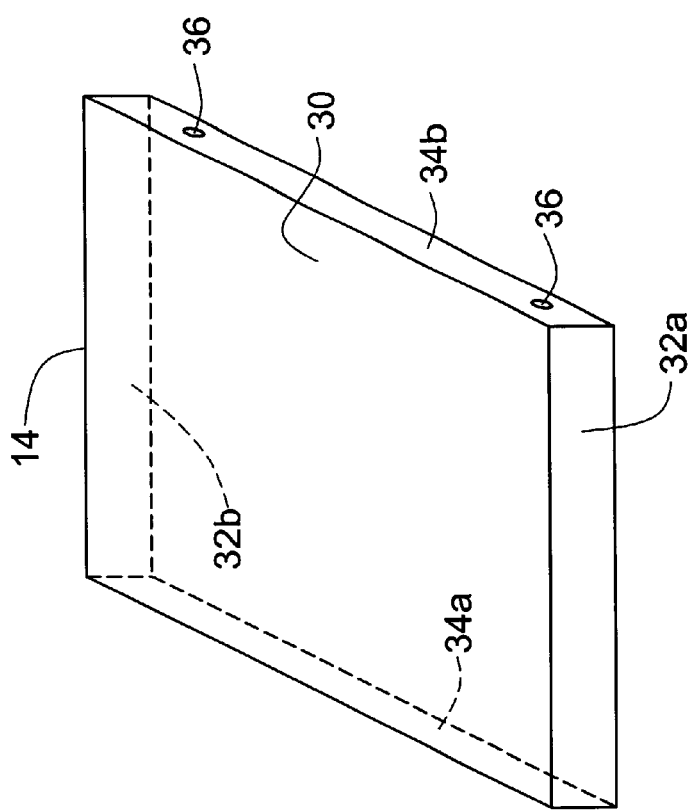
FIG. 3 is a perspective view of a lid for use in constructing the modular enclosure depicted in FIG. 1.

The lid 14 is further illustrated in FIG. 3. Referring to FIG. 3, the lid 14 comprises a unitary structure including a top portion 30, front and rear sidewalls 32a and 32b, respectively, and left and right sidewalls 34a and 34b respectively. The left and right sidewalls 34a and 34b have opposing interior surfaces which are spaced apart by a distance which is slightly greater than the distance between the outward facing tab surfaces of opposing tabs 16. Thus, the lid 14 may be disposed over the tabs 16 such that the tabs 16 are in generally confronting relation with the inner surface of the respective lid sidewalls 34a and 34b. The depth of the lid 14 (from the outer surface of the front sidewall 32a to the outer surface of the rear sidewall 32b) is approximately equal to the distance between the front and rear edges 20a and 20b (See FIG. 2), respectively.

The lid 14 has openings 36 selectively located on the left and rear sidewalls 34a and 34b respectively such that the openings 36 are generally coaxially aligned with openings 18 of the tabs 16 when the lid 14 is disposed over the base 12 in a mounting position as depicted in FIG. 1.

Figure 4:
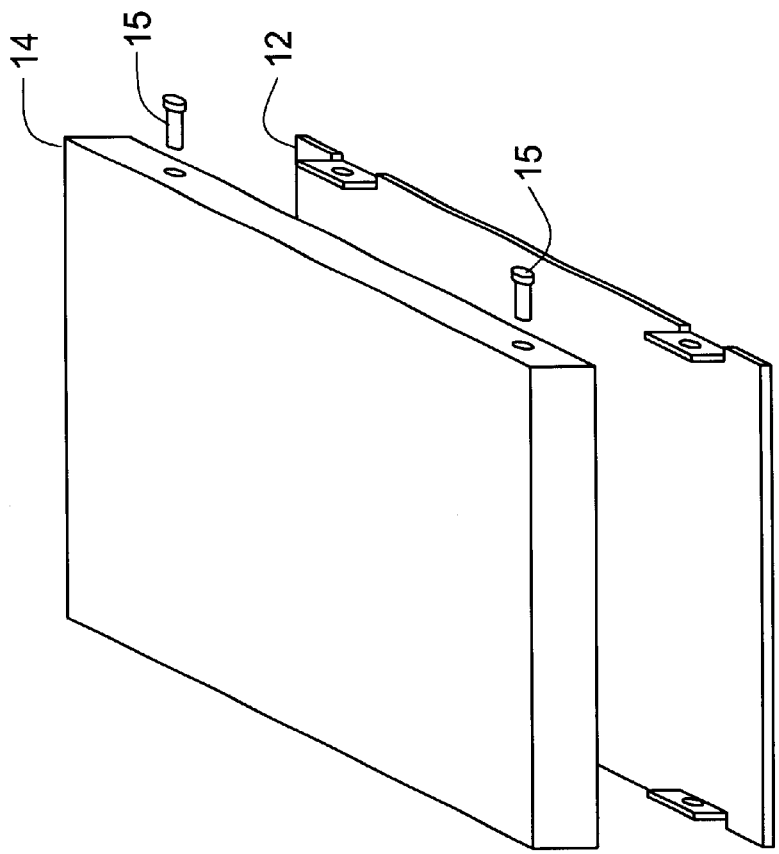
FIG. 4 is an exploded perspective view of the modular enclosure of FIG. 1.

As seen in FIGS. 1 and 4, the lid 14 may be fastened to the base 12 via the use of fasteners 15. The fasteners 15 may comprise sheet metal screws or any other suitable self-threading screws. In such event, the openings 36 in the lid 14 are sized to receive the screws via a clearance fit and the openings 18 within the tabs 16 are sized such that the self-threading screws thread into the tabs 16. As an alternative fastening technique, a nut may be spot welded or otherwise affixed to the inward facing tab surface and the lid 14 affixed to the base 12 by passing an appropriately sized machine screw through the opening 36, further through an opening 18 in the tab 16 and threading the machine screw through the nut. Any other suitable fastener or fastening technique may be employed to affix the lid 14 to the base 12.

The modular enclosure of FIG. 1 is depicted in an exploded view in FIG. 4. As is apparent, the height of the tabs 16 present the sole limitation on the height of the overall enclosure 10 thus permitting an enclosure having a very small height to be achieved. It should be recognized that the height of the tabs may be less than the interior height of the lid 14 and that the tabs need only be of sufficiently height to accommodate an appropriate fastener.

In a preferred embodiment, the modular enclosure is fabricated of sheet metal, such as 0.040 inch thick aluminum. It should be appreciated that any other sheet metal may be employed. Moreover, a modular enclosure having the present design may be fabricated of plastic in which event the tabs 16 may be provided with a greater thickness suitable to provide secure mounting of the lid 14 to the base 12.

It should further be appreciated that while in the present embodiment, two tabs are illustrated along each edge of the base 12, additional tabs 16 may be provided. Moreover, a single tab may be provided along a substantial portion of the length of the respective side edges of the base and one or more openings provided in the tab to permit mounting of the lid 14 to the base 12 as previously discussed. By providing a single tab along a substantial portion of the length of the respective edges of the base 12 additional rigidity may be achieved.

Figure 5:
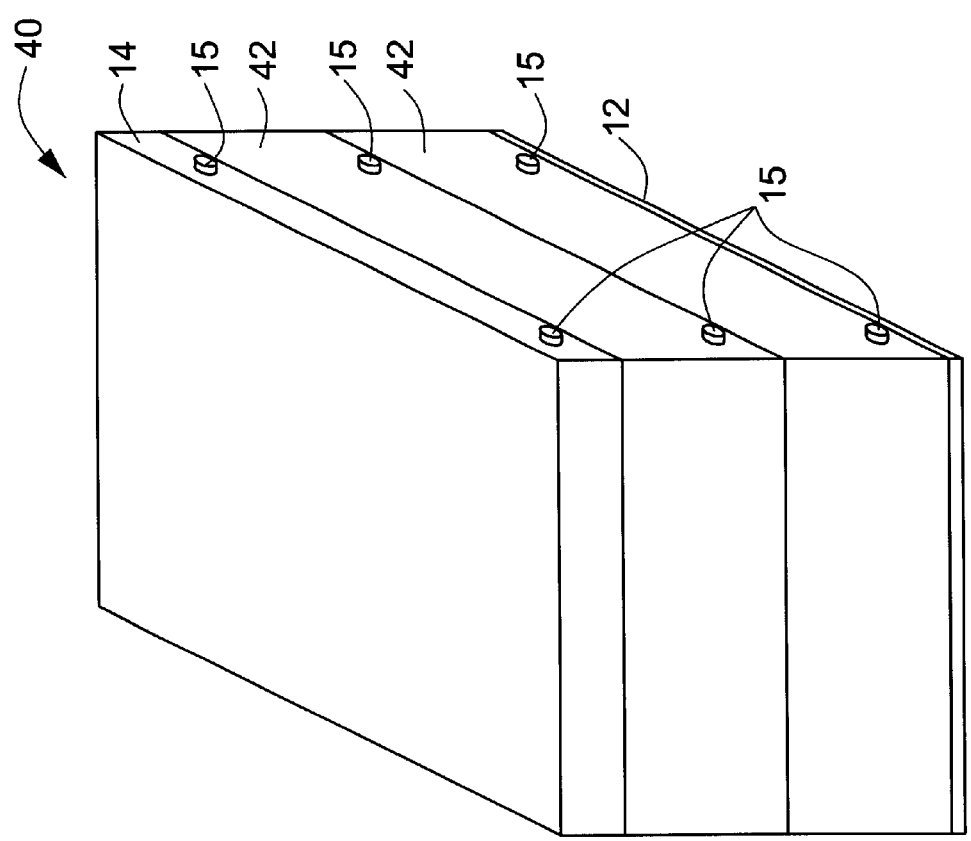
FIG. 5 is a perspective view of another preferred embodiment of the presently disclosed modular enclosure that includes two intermediate frame members between a base and a lid.

To obtain an enclosure having a greater height than that obtained in the embodiment of FIG. 1, one or more intermediate frame members may be disposed between the base 12 and the lid 14. Such a configuration is illustrated in FIG. 5. Referring to FIG. 5, a modular enclosure 40 includes the base 12, the lid 14 and intermediate frame members 42. Two intermediate frame members 42 are depicted in the modular enclosure 40 depicted in FIG. 5 although one or more intermediate frame members 42 may be employed to obtain an enclosure of desired height.

Figure 6:
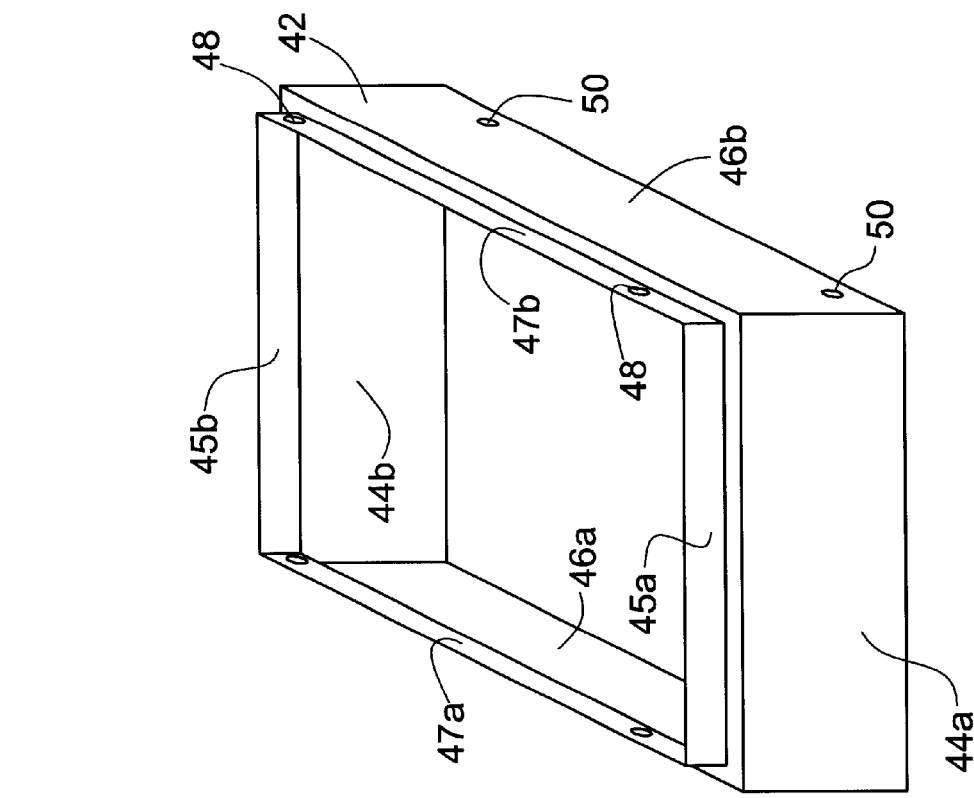
FIG. 6 is a perspective view of a frame member employed in constructing the modular enclosure of FIG. 5.

Additionally, to provide the ability to obtain a finer granularity of desired heights, intermediate frame members 42 of different heights may be provided and used alone or in combination with other intermediate frame members 42 of the same or different heights to obtain an overall desired height for the modular enclosure. The general structure of the intermediate frame member 42 is illustrated in greater detail in FIG. 6. Referring to FIG. 6, the intermediate frame member 42 includes a front sidewall 44a, a rear sidewall 44b, a left sidewall 46a and a right sidewall 46b. In the illustrated embodiment, the intermediate frame members 42 are fabricated of sheet metal such as 0.040 inch aluminum sheet stock. The intermediate frame member is formed by forming and bending sheet metal stock to obtain the desired shape and joining the formed stock at a corner such as via a corner weld. Alternatively, extruded stock may be employed which is bent to form the desired frame member shape. Additionally, the intermediate frame members 42 may be fabricated as an integrally formed injection molded plastic part and via any other suitable plastic molding or forming technique.

As illustrated in FIG. 6, a lip is provided along the upper edge of each of the sidewalls. More specifically, lip 47a is provided along the upper edge of sidewall 46a, lip 45b is provided along the upper edge of the rear sidewall 44b, lip 47b is provided along the upper edge of sidewall 46b and lip 45a is provided along the upper edge of the front sidewall 44a of the frame member 42. The lips are recessed sufficiently from the outer surface of the respective sidewalls to permit the lid or another sidewall to be stacked on the respective frame member 42. Additionally, the width and depth of the frame member 42 is selected to generally coincide with the width and the length of the base and the lid.

As illustrated in FIG. 6, the intermediate frame members 42 include first openings 48 through the lips 47a and 47b. The openings 48 are positioned along the lip so that the openings 48 are generally coaxially aligned with the openings 36 in the lid 14 when the lid is disposed in assembled relation with the frame member 42 as seen in FIG. 5. Similarly, the openings 48 through the lips 47a and 47b of a lower frame member 42 generally align with the openings 50 of another frame member 42 mounted on top of the lower frame member. Finally, the openings 50 in the sidewalls of the frame member 42 align with the openings 18 in the tabs 16 when the frame member 42 is disposed in assembled relation on the base 12.

While the lips extend around the upper periphery of the frame member 42 sidewalls, it should be appreciated that the lips need not extend along the full length of the respective sidewalls. For example, positioning tabs may be recessed from the outer sidewall surfaces and extend above the respective sidewalls so as to maintain the stacking relation of the respective components of the enclosure. The positioning tabs may include the openings, such as openings 48 to permit fastening of the respective components as described above.

Figure 7:
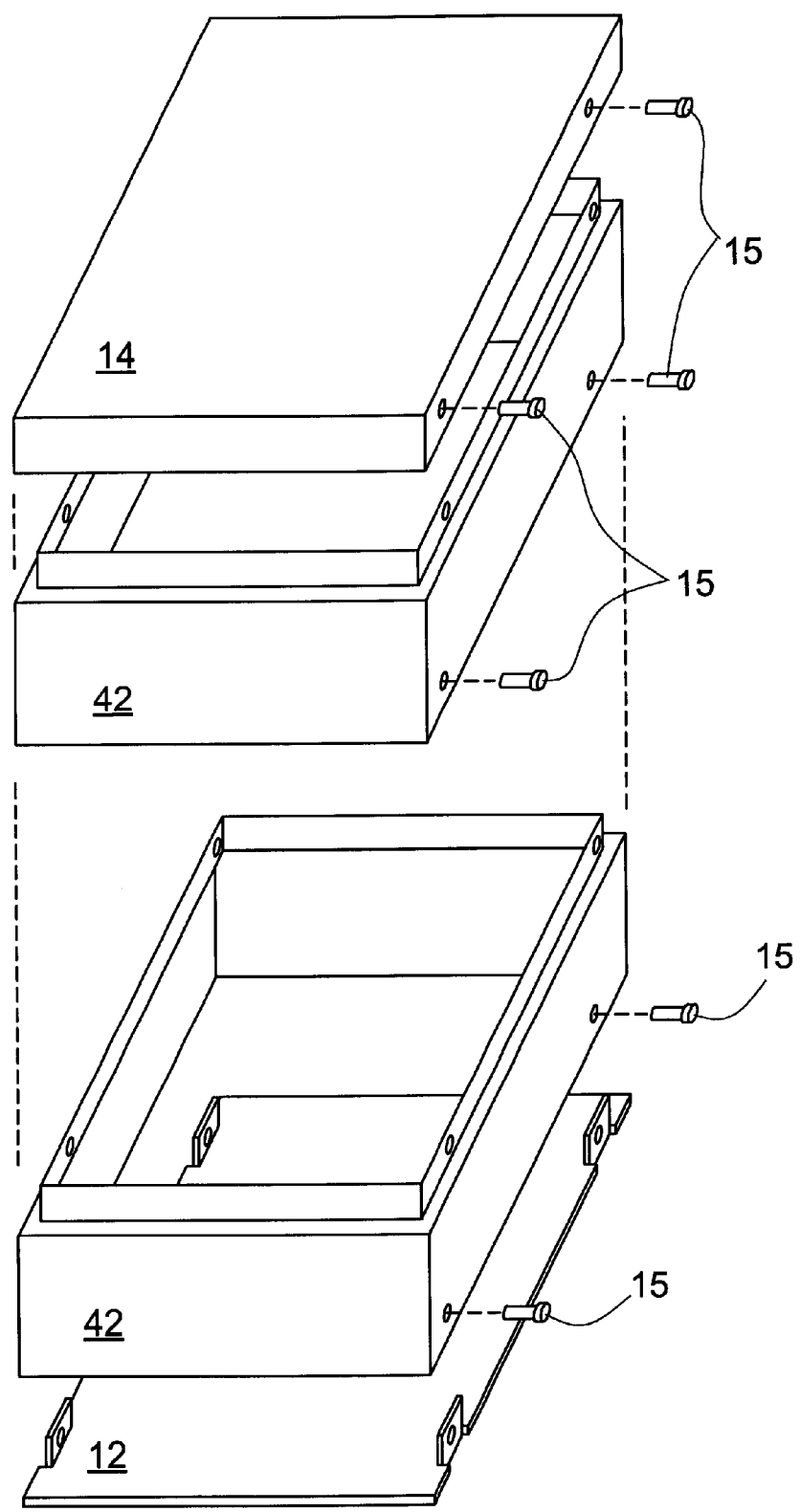
FIG. 7 is an exploded perspective view of the modular enclosure of FIG. 5.

The modular enclosure of FIG. 5 is shown in an exploded perspective view in FIG. 7.

It should further be noted that while the base 12 and the lid 14 are shown as the bottom and top of the enclosure, it is apparent that each of the base or the lid may be employed as either the front or the rear of the enclosure or the sides. It is recognized that it may be advantageous to orient the enclosure such that the base or lid constitutes the front or rear panel in practice, since such an orientation presents a surface at the front or the rear of the enclosure which is free of seams and discontinuities. This may be preferable for mounting of certain components, connectors, displays, etc. to the respective surfaces. Accordingly, it should be understood that the references to base, lid, left and right sidewalls, etc. are intended to provide a referential orientation for the illustrated embodiment and not intended to suggest how the enclosure is to be oriented or employed in practice.

It will be appreciated by those of ordinary skill in the art that modifications to and variations of the disclosed embodiments may be made without departing from the inventive concepts described herein. Accordingly, the invention should not be viewed as limited except by the scope and spirit of the appended claims.

What is claimed is:

1. A modular enclosure comprising:
   a generally rectangular base having first and second opposing side edges and a first base surface corresponding to an interior base surface of said enclosure;
   a unitary lid having a generally rectangular top portion with opposing side edges, front and rear edges, said lid including opposing sidewalls extending generally perpendicularly from said opposing side edges with respect to said top portion, and front and rear walls extending generally perpendicularly from said front and rear edges with respect to said top portion;
   at least one unitary frame member having a first pair of opposing sidewalls each having an upper edge and an outer surface, and front and rear frame member sidewalls having an upper edge and an outer surface, said upper edges of said opposing sidewalls and said upper edges of said front and rear frame member sidewalls providing a continuous periphery having a common height, said at least one unitary frame member having a lip extending along at least a portion of the upper edge of each of said opposing sidewalls, said lip being recessed from the outer surface of the respective sidewall; and
   said at least one unitary frame member being configured to permit said at least one unitary frame member to be mounted between said lid and said base in stacking relation to form said modular enclosure.

2. The modular enclosure of claim 1 wherein said lid sidewalls each include at least one sidewall opening, said frame member lip includes at least one lip opening, and said lid sidewall opening and lip opening are selectively positioned so as to be generally coaxially aligned when said lid is disposed in assembled relation over said lip of the frame member.

3. The modular enclosure of claim 2 further including a fastener extending through said lip opening of the frame member and said sidewall opening for fixably mounting the frame member to said lid.

4. The modular enclosure of claim 3 further including a nut having a threaded opening mounted to an inner surface of said lip such that said threaded nut opening is generally aligned with the corresponding lip opening, wherein said fasteners comprise a machine screw cooperative with said nut to fixably mount the frame member to said lid.

5. The modular enclosure of claim 3 wherein said fastener comprises a self threading screw.

6. The modular enclosure of claim 1 wherein said base, lid and at least one frame member comprise sheet metal components.

7. The modular enclosure of claim 1 wherein said base, lid and at least one frame member comprise plastic components.

8. The modular enclosure of claim 1, further comprising at least a second unitary frame member having a first pair of opposing sidewalls each having an upper edge and an outer surface, and front and rear frame member sidewalls having an upper edge, said upper edges of said opposing sidewalls and said upper edges of said front and rear frame member sidewalls providing a continuous periphery having a common height, said second unitary frame member having a lip extending along at least a portion of the upper edge of each of said opposing sidewalls, said lip being recessed from the outer surface of the respective sidewall.

9. The modular enclosure of claim 1, further comprising at least a second unitary frame member configured to permit said second unitary frame member to be mounted between said lid and said at least one unitary frame member in stacking relation to form said modular enclosure.

10. A modular enclosure comprising:
    a generally rectangular base having first and second opposing side edges and a first base surface corresponding to an interior base surface of said enclosure; wherein said base includes at least one mounting tab extending generally perpendicularly from said first base surface adjacent each of said first and second opposing edges, said at least one mounting tab having an opening for receiving a fastener;
    a unitary lid having a generally rectangular top portion with opposing side edges, front and rear edges, said lid including opposing sidewalls extending generally perpendicularly from said opposing side edges with respect to said top portion, and front and rear walls extending generally perpendicularly from said front and rear edges with respect to said top portion;
    at least one unitary frame member having a first pair of opposing sidewalls each having an upper edge, and front and rear frame member sidewalls, said upper edge of each of said opposing sidewalls extending continuously from an upper edge of each of said front and rear frame member sidewalls, said at least one unitary frame member having a lip extending along at least a portion of the upper edge of each of said opposing sidewalls, said lip being recessed from an outer surface of the respective sidewall;
    said at least one unitary frame member being configured to permit said at least one unitary frame member to be mounted between said lid and said base in stacking relation to form said modular enclosure; and
    said at least one frame member having at least one lower frame member opening selectively positioned in a respective one of the sidewalls such that said at least one lower frame member opening aligns with said at least one mounting tab opening when said at least one frame member is disposed in assembled relation to said base.

11. The modular enclosure of claim 10 further including a fastener extending through said at least one lower frame member opening and said mounting tab opening for fixably mounting said frame member to said base.

12. The modular enclosure of claim 10, further including a nut having a threaded opening mounted to an inner surface of said mounting tab such that said threaded nut opening is generally aligned with the corresponding tab opening, wherein said fastener comprises a machine screw cooperative with said nut to fixably mount the respective frame member to said base.

13. The modular enclosure of claim 10, wherein said fastener comprises a self threading screw.

* * * * *